United States Patent [19]

DeMaso et al.

[11] Patent Number: 5,072,074
[45] Date of Patent: Dec. 10, 1991

[54] HIGH YIELD COMBINED RIGID AND FLEXIBLE PRINTED CIRCUITS AND METHOD OF MANUFACTURE

[75] Inventors: Arthur J. DeMaso, Pepperell, Mass.; Thomas H. Stearns, Nashua, N.H.

[73] Assignee: Interflex Corporation, Manchester, N.H.

[21] Appl. No.: 557,526

[22] Filed: Jul. 24, 1990

[51] Int. Cl.[5] ............................................. H05K 1/00
[52] U.S. Cl. .................................... 174/254; 174/256; 174/259; 361/398; 361/414; 156/251; 156/123
[58] Field of Search ........................ 361/398, 397, 414; 174/254, 256, 259; 156/123, 145, 251

[56] References Cited

U.S. PATENT DOCUMENTS 4,533,787  8/1985  Anderegg et al. ................. 174/256
4,800,461  1/1989  Dixon et al. ........................ 174/254

OTHER PUBLICATIONS

Messerschmitt, *Multilayered Circuit Board Mfg. Method*, Derwent Publications Ltd., v-4, 1987.

*Primary Examiner*—Leo P. Picard
*Assistant Examiner*—Trinidad Korka
*Attorney, Agent, or Firm*—Davis, Bujold & Streck

[57] ABSTRACT

This is a printed circuit comprising multiple layers and rigid and flexible portions and including a sheet of flexible substrate material extending over the entirety of the rigid and flexible portions and paths of conductive material carried by at least one side of the sheet of flexible substrate material. This invention comprises, a sheet of flexible over-layer material extending over at least the entirety of all the flexible portions; a flexible adhesive material adhesively attaching the sheet of flexible over-layer material to the entirety of all the flexible portions; sheets of a rigid substrate material extending over the entirety of all the rigid portions; and, a rigid ahesive material adhesively attaching the sheets of a rigid substrate material to the entirety of all the rigid portions. The rigid adhesive attaching the sheets of rigid substrate to the rigid portions may extend out over the edge of the rigid portions onto the flexible portions to form a protective edge. The sheet of flexible over-layer material may also extend over the rigid portions and be attached with a rigid adhesive.

16 Claims, 4 Drawing Sheets

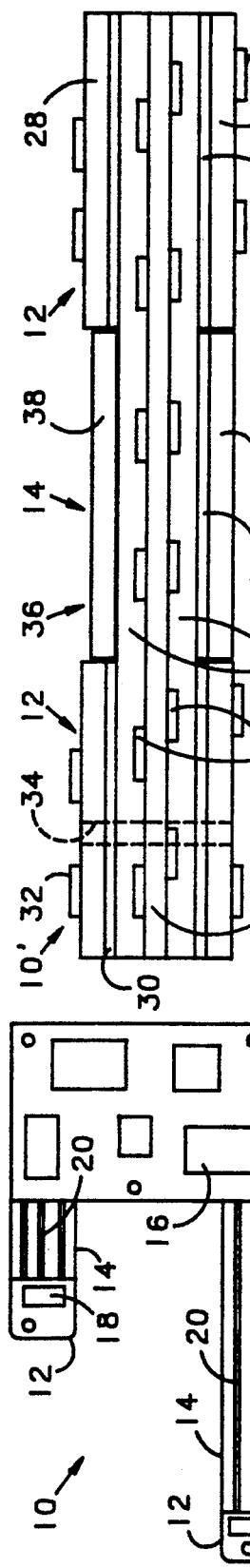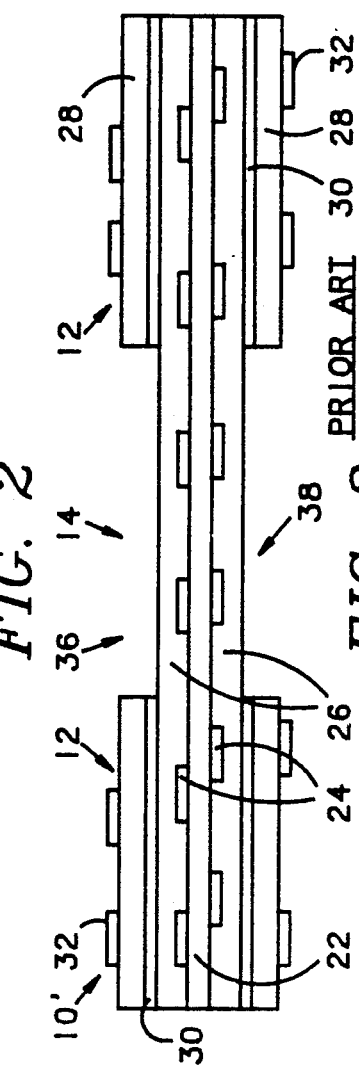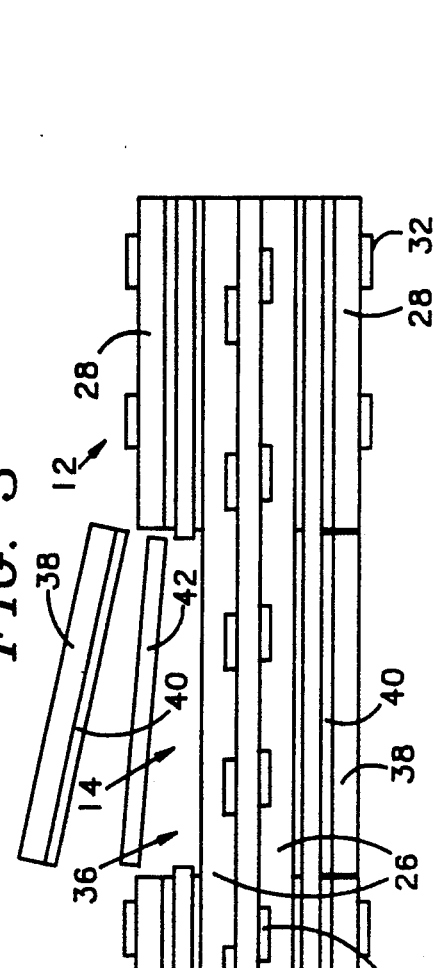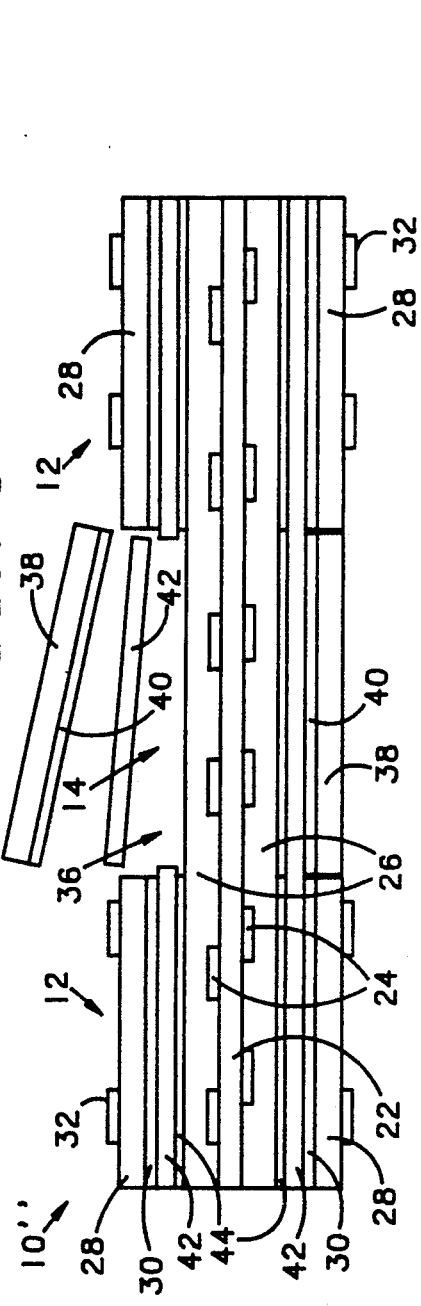

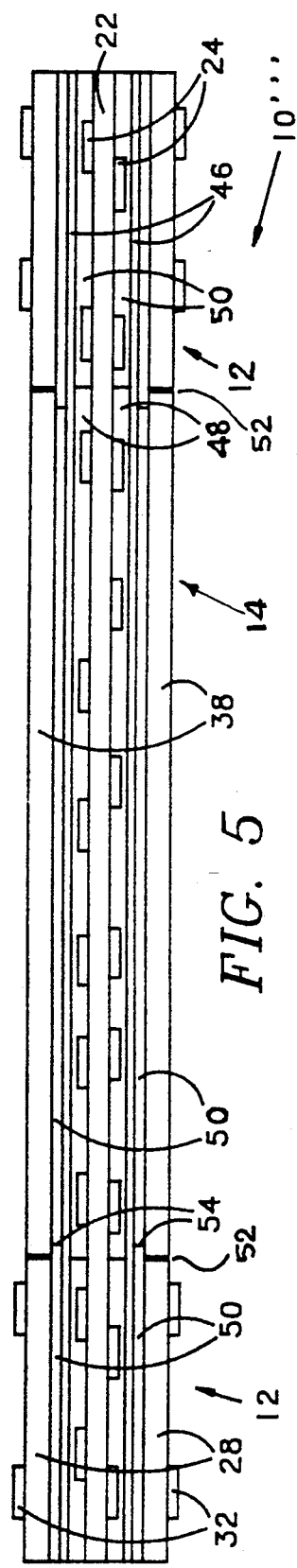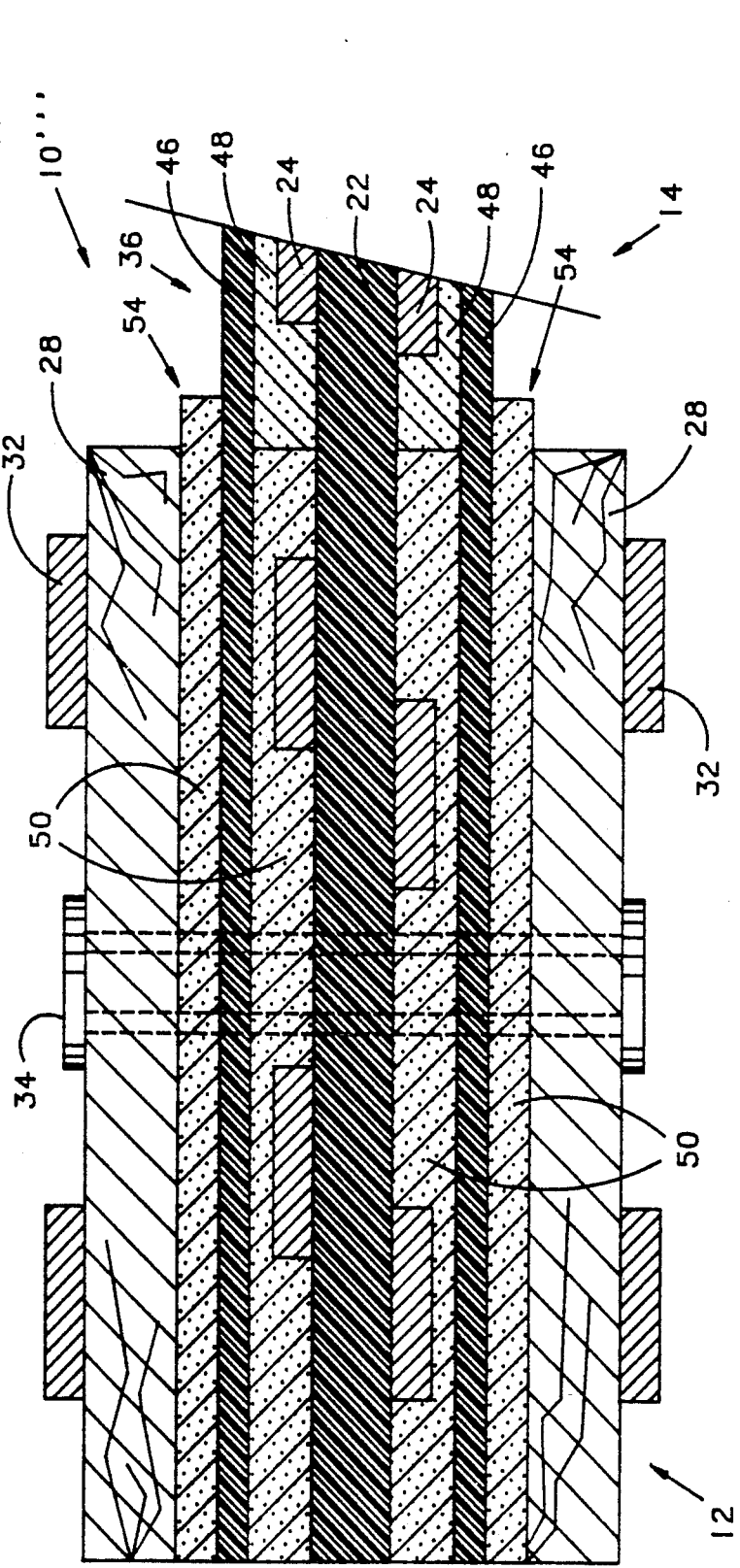

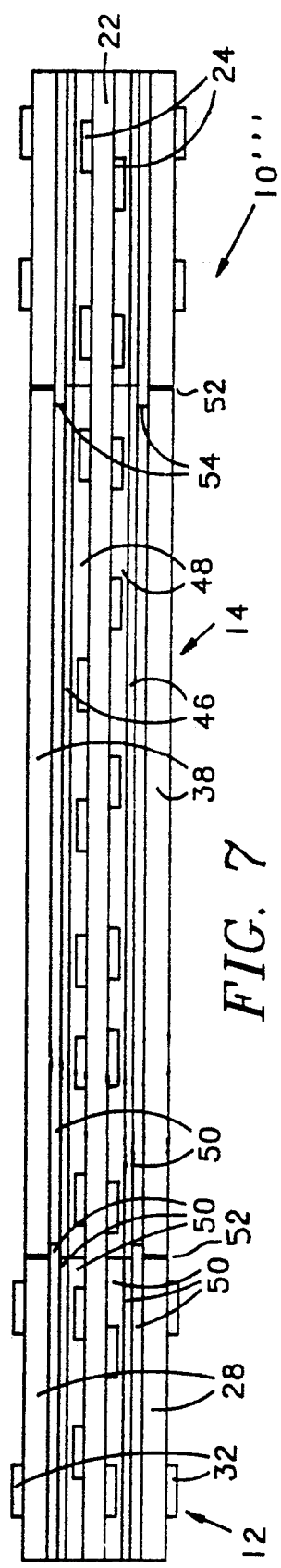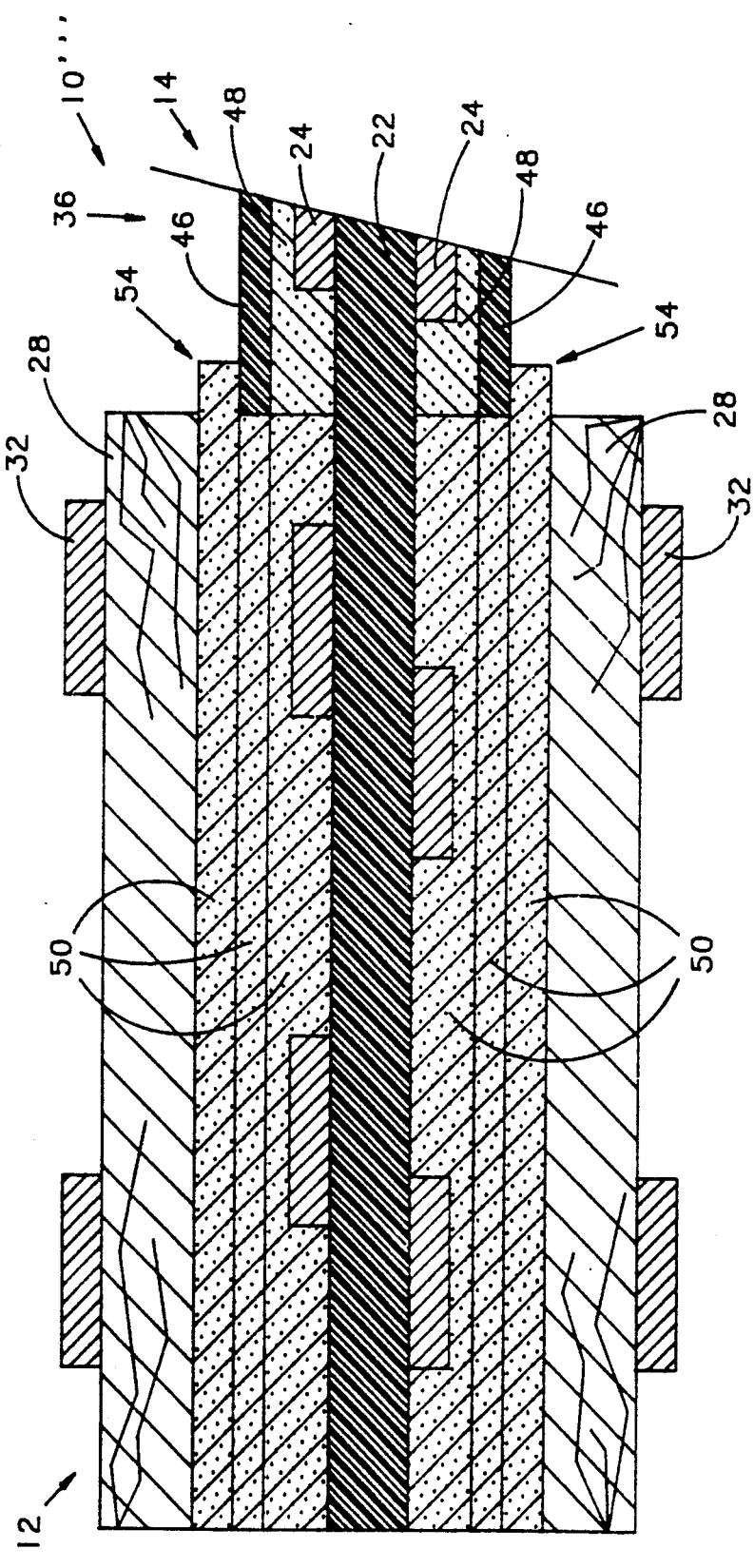

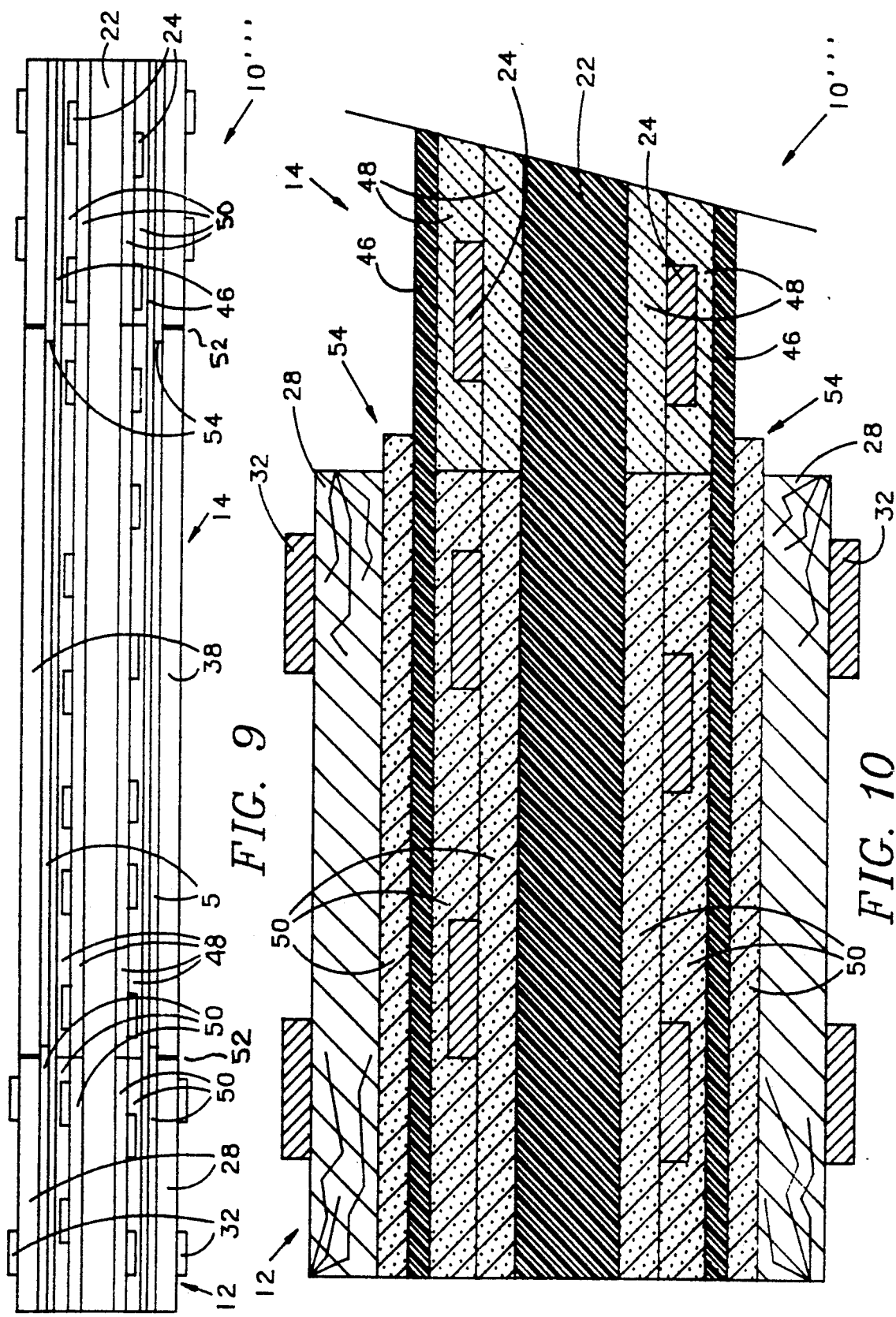

HIGH YIELD COMBINED RIGID AND FLEXIBLE PRINTED CIRCUITS AND METHOD OF MANUFACTURE

BACKGROUND OF THE INVENTION

This invention relates to printed circuits and their method of manufacture and, more specifically, to a printed circuit comprising multiple layers and rigid and flexible portions comprising, a sheet of flexible substrate material extending over the entirety of the rigid and flexible portions; paths of conductive material carried by at least one side of the sheet of flexible substrate material; a sheet of flexible over-layer material extending over at least the entirety of all the flexible portions; a flexible adhesive material adhesively attaching the sheet of flexible over-layer material to the entirety of all the flexible portions; sheets of a rigid substrate material extending over the entirety of all the rigid portions; and, a rigid adhesive material adhesively attaching the sheets of a rigid substrate material to the entirety of all the rigid portions.

The printed circuits to be described hereinafter are generally very thin in cross section being constructed of multiple layers of film materials (conductive, insulative, and adhesive). In the interest of ease of drawing and understanding only, it should be readily recognized and understood by those skilled in the art that the drawing figures which accompany the written descriptions are not to scale.

Printed circuits combining rigid and flexible portions are known in the art and are popular in many applications such as automotive and aircraft. Such printed circuits allow modern printed circuit-mounted electronic components to be mounted and interconnected without the need for prior art wiring "harnesses" which were prone to damage, mis-wiring, and the like. As depicted in simplified form in FIG. 1 by way of example, such a combined printed circuit 10 may include several rigid portions 12 interconnected by flexible portions 14. Typically, the rigid portions 12 have components 16 and connectors 18 mounted thereon while the flexible portions 14 provide the interconnecting conductors 20 which replace the wires of the prior art wiring harnesses.

As is well known to those skilled in the art, printed circuits can be made by various deposition and etching processes. For example, one may start with an insulative substrate and deposit conductive paths and portions on one or both sides. In the alternative, one may start with an insulative substrate having a conductive layer on one or both sides and form the conductive paths and portions by removing un-needed portions of the conductive layer(s) using, for example, a chemical etching process through a mask. Such techniques are applicable to both rigid and flexible substrates so as to form rigid and flexible printed circuits. Since the manufacturing techniques are applicable to both rigid and flexible printed circuits, combined rigid and flexible printed circuits can be formed in a single process using a common technique.

While the first printed circuits were typically a single layer of substrate having conductive portions formed on one or both sides, many printed circuits employed now comprise several layers with the individual layers being adhesively bonded together into a unitary structure. To provide inter-layer electrical connections, aligned holes through the layers (known as vias) are internally plated with a conductive material. Under ideal conditions, the foregoing structure and general method of manufacture presents no problems. Under actual manufacturing conditions, however, various problems present themselves. The result is a diminishing of the yield of the manufacturing process; that is, the various problems to be described shortly result in defects in the resultant printed circuits which make them unreliable and, therefore, unusable. As those skilled in the art are well aware, process yield is a most important factor in electronics manufacturing. Pricing and competitiveness (as well as product quality and reputation) depend on high yields of reliable components and products produced therefrom. Thus, it is of vital importance that the manufacturing processes used to make such multi-layer, combined rigid and flexible printed circuits result in high yields and constantly reliable parts.

Typical prior art approaches to the construction and manufacturing of combined rigid and flexible printed circuits can be seen with reference to, for example, U.S. Pat. No. 4,687,695 (Hamby) or 4,800,461 (Dixon et al.). A typical prior art approach and its associated problems is depicted in simplified form in FIGS. 2 and 3. As with the printed circuit 10 of FIG. 1, there is a multi-layer printed circuit 10' having rigid portions 12 and a flexible portion 14. At the core or center of the circuit 10' there is a flexible substrate 22 having first conductors 24 formed on the outer surface thereof according to any of the many techniques known to those skilled in the art. The substrate 22 and first conductors 24 are protected on both sides by a flexible overcoating material 26 which adhesively bonds thereto. The rigid portions 12 are created by attaching a rigid substrate 28 over the overcoating material 26 employing a flexible adhesive material 30. The rigid substrate 28, of course, also includes second conductors 32 formed thereon as necessary.

While the rigid substrates 28 with the second conductors 32 pre-formed thereon could be adhesively attached to overcoating material 26, for registration reasons, the creation of the plated vias, etc. it is more typical to attach the rigid substrate 28 to the overcoating material 26 using aligning holes through the various layers (not shown) and to then form the second conductors 32 and the vias (shown ghosted as 34) in separate manufacturing steps. It is this approach which causes the manufacturing problems leading to reduced yield and reliability mentioned earlier herein. Because of the heat used in testing processes, there is considerable difference in the thermal expansion which occurs in the adhesive material 30 and the various other materials. As a result, voids are created in the adhesive material 30 and cracking may occur in the conductive plating material of the vias 34. This can cause patent defects which decrease the yield or, more serious, latent defects which can cause the final product to fail or malfunction suddenly and unexpectedly at a later time.

Another problem in the prior art is adverse chemical reactions during the manufacturing process. Typically, windows 36 are formed in the rigid substrates 28 in areas which are to be flexible in the final printed circuit 10'. To prevent the chemicals employed in formimg the vias 34 and/or second conductors 32 from damaging the underlying flexible portion 14, a blocking piece 38 is located in each window 36. A blocking piece 38 can be located in the window 36 as shown on the upper layer of FIG. 2; but, in such case, will be relatively ineffective in blocking the chemicals, which can simply flow around the edges and under the blocking piece 38. The blocking piece may also move out of registration. More typically, therefore, in such a prior art approach to manufacturing, the blocking piece 38 is held in place by adhesive 40. This aids, to aome degree, the chemical leakage problem—but doesn't always and completely solve it. On the other hand, it can introduce a new problem when removed after manufacture as depicted in FIG. 3.

A solution to this latter problem is disclosed in co-pending application Ser. No. 07/209,826, filed 6.22.88, which is assigned to the common assignee of this application. It is also depicted in simplified form in FIG. 4 hereof. For ease of understanding, elements of the printed circuit 10" of FIG. 4 which are common to the printed circuit 10' FIGS. 2 and 3 are designated with common numbers. Thus, there is once again a flexible substrate 22 having first conductors 24 formed on the outer surface thereof at the core or center of the circuit 10". The substrate 22 and first conductors 24 are protected on both sides by a flexible overcoating material 26 adhesively bonded thereto. The rigid portions 12 comprise a rigid substrate 28 including second conductors 32 formed thereon as necessary. At that point, the construction of the printed circuit 10" changes to implement the novel aspects of that co-pending application. As depicted in the bottom layer of the printed circuit 10" of FIG. 4, a protective layer 42 is placed over the entirety of the overcoating material 26—but, only adhesively attached (as with adhesive 44) over those portions thereof which are to be part of the rigid portions 12. In other words, in the "window" areas 36 the protective layer 42 simply covers the overcoating material 26, but is not adhesively attached thereto. The rigid substrate 28 is then attached to the protective layer 42 with adhesive material 30. The blocking pieces 38 or portions 38 are integral with but partially separated from the remainder of substrate 28 so that they may be readily removed after manufacture. When the manufacturing process is complete and the chemicals have been washed from the completed printed circuit 10", the blocking pieces 38 and the portions of the protective layer 42 within the window 36 are removed as depicted in the top layer of the printed circuit 10" of FIG. 4. No damage occurs to the overcoating material 26 and the portions under it when the protective layer 42 within the window 36 is removed since it is not adhesively attached to the overcoating material 26.

As those skilled in the art will readily recognize and appreciate, the novel approach of the above-described co-pending application solves the problem of the blocking pieces 38 and eliminates the possibility of chemical damage of the prior art over which it is an improvement; however, it does not address the above-described problem of voids being created in the adhesive layers and/or the problem of cracking of the plating within the vias from thermal expansion differences.

Wherefore, it is the object of this invention to provide a construction for printed circuits combining rigid and flexible portions and a method of manufacture thereof which eliminates not only the possibility of chemical damage but also both the problem of voids being created in the adhesive layers and the problem of cracking of the plating within the vias from thermal expansion differences.

Other objects and benefits of the invention will become apparent to those skilled in the art from the detailed description which follows hereinafter when taken in conjunction with the drawing figures which accompany it.

SUMMARY

The foregoing object has been achieved by the printed circuit comprising multiple layers and rigid and flexible portions of the present invention comprising, a sheet of flexible substrate material extending over the entirety of the rigid and flexible portions; paths of conductive material carried by at least one side of the sheet of flexible substrate material; a sheet of flexible over-layer material extending over at least the entirety of all the flexible portions; a flexible adhesive material adhesively attaching the sheet of flexible over-layer material to the entirety of all the flexible portions; sheets of a rigid substrate material extending over the entirety of all the rigid portions; and, a rigid adhesive material adhesively attaching the sheets of a rigid substrate material to the entirety of all the rigid portions.

According to one variation, the paths of conductive material carried by at least one side of the sheet of flexible substrate material comprise a conductive foil adhesively attached to the sheet of flexible substrate material with a flexible adhesive in the flexible portions and with a rigid adhesive in the rigid portions.

According to another variation, the rigid adhesive adhesively attaching the sheets of a rigid substrate material to the entirety of all the rigid portions extends out over the edge of the rigid portions onto the flexible portions over the sheet of flexible over-layer material whereby the sheet of flexible over-layer material is protected from edge portions of the rigid substrate material at points of flexing of the flexible portion adjacent thereto.

According to yet another variation, the sheet of flexible over-layer material also extends over the entirety of all the rigid portions and a rigid adhesive material adhesively attaches the sheets of flexible over-layer material to the entirety of all the rigid portions.

DESCRIPTION OF THE DRAWINGS

FIG. 1 is a simplified plan view of a prior art combined rigid and flexible printed circuit of a type which can be made according to the present invention.

Fig. 2 is an edge view of a portion of a prior art combined rigid and flexible printed circuit at one stage of manufacture and depicting two prior art approaches to protecting the flexible portions during manufacture.

FIG. 3 is an edge view of the portion of a prior art combined rigid and flexible printed circuit of FIG. 2 after the flexible portions have had the protective members removed therefrom.

FIG. 4 is an edge view of a portion of another prior art combined rigid and flexible printed circuit at one stage of manufacture and depicting its approach to protecting the flexible portions during manufacture.

FIG. 5 is an edge view of a portion of a combined rigid and flexible printed circuit according to the present invention in one embodiment thereof at one stage of manufacture and depicting its unique approach to protecting the flexible portions during manufacture while simultaneously improving manufacturing yields by preventing chemical damage, voids in adhesive layers, and damage to through-layer vias in the rigid portions.

FIG. 6 is an enlarged, cutaway view of one rigid portion and an adjacent part of the flexible portion of the combination rigid and flexible printed circuit of FIG. 5.

FIG. 7 is an edge view of a portion of a combined rigid and flexible printed circuit according to the present invention in a second embodiment thereof at one stage of manufacture.

FIG. 8 is an enlarged, cutaway view of one rigid portion and an adjacent part of the flexible portion of the combined rigid and flexible printed circuit of FIG. 7.

FIG. 9 is an edge view of a portion of a combined rigid and flexible printed circuit according to the present invention in a third embodiment thereof at one stage of manufacture.

FIG. 10 is an enlarged, cutaway view of one rigid portion and an adjacent part of the flexible portion of the combined rigid and flexible printed circuit of FIG. 9.

DESCRIPTION OF THE PREFERRED EMBODIMENT:

A printed circuit 10''' according to the present invention in one embodiment is shown in edge view in FIG. 5 and one end is shown enlarged and cutaway in FIG. 6. A second embodiment is similarly shown in FIGS. 7 and 8 while a third is shown in FIGS. 9 and 10. Again, for ease of comparison and understanding, elements of the printed circuits 10''' which are common to the printed circuit 10'' of FIG. 4 and printed circuit 10' of FIGS. 2 and 3 are designated with common numbers. As will be appreciated from the descriptions of the various embodiments of the present invention contained hereinafter, the common element and major point of novelty is the use of rigid adhesives in the rigid areas of the printed circuit and flexible adhesives in the flexible areas thereof. That is, unlike the prior art approaches which employ a uniform adhesive coating across the layers of the printed circuit during its steps of manufacture where needed, in the present invention the adhesive layers are comprised of different adhesives on the same layer.

With reference first to the embodiment of FIGS. 5 and 6, as will be seen from the numbering there is once again a flexible substrate 22 having first conductors 24 formed on the outer surface thereof at the core or center. The substrate 22 and first conductors 24 are protected on both sides by flexible over-layers 46 bonded thereto with a flexible adhesive 48 in the flexible portions 14 and a rigid adhesive 50 in the rigid portions 12. The rigid portions 12 again comprise a rigid substrate 28 including second conductors 32 formed thereon as necessary. In the printed circuit 10''' of this invention, the flexible over-layers 46 take the place of the protective layers 42 of FIG. 4; but, perform the same protective function with respect to any possible chemical damage during later manufacturing steps. The rigid substrate 28 is attached to the over-layers 46 with the rigid adhesive material 50 and the blocking portions 38 fill the windows 36 these being held in place by their connection to the remainder of the substrate 28 at the location of grooves 52 which facilitate later removal of the portiona 38. During manufacture the adhesive material layers 50 which attach the substrates 28 to the over-layers 46 extend under the blocking portions 38 throughout the windows 36. A release coating is provided between the layers 50 and the over-layers 46 to facilitate removal of the blocking portions 38 and the immediately underlying adhesive 50 after manufacture. Note in particular in the enlarged view of FIG. 6 that the rigid adhesive material 50 used to attach the substrate 28 to the over-layer 46 extends out slightly from the edge of the rigid substrate 28 adjacent the flexible portion 14. This extende portion 54 can be straight along its inner edge as depicted or, if desired, can be angled back towards the substrate 28. It can also be formed of a single layer of the adhesive material 50 or of multiple layers. Thus, during any subsequent chemical steps of the manufacturing process, there is complete protection by the substrate 28 including portions 38 and by over layers 46.

To facilitate removal of the adhesive 50 in the windows, the layer 50 is die cut at the inner extension of the extended portions 54. The extended portions 54 act, in use, as stress relievers of the area of the circuit structures at junctions between rigid and flexible portions thereof. When the manufacturing process is complete and the chemicals have been washed from the completed printed circuit 10''', the blocking portions 38 and the adhesive 50 within the windows 36 are easily removed without damage to the underlying portions of the flexible portion 14. Moreover, since the rigid substrates 28 are attached to the over-layers 46 with the rigid adhesive material 50, there is no excessive thermal expansion of the adhesive material 50 during the subsequent testing steps and, therefore, no voids are formed and no cracking can take place in the plating material of the vias 34.

The embodiment of FIGS. 7 and 8 is substantially the same as that of FIGS. 5 and 6 with one exception. The over-layers 46 extend only over the windows 36 that comprise the flexible portions 14 of the final printed circuit 10'''. The portion of the layer not including the over-layer therein under the substrate 28 comprises an additional quantity (or layer(s)) of the rigid adhesive 50. Thus, in this embodiment, with the exception of the flexible substrate 22 at its center, the entirety of the rigid portion 12 is comprised of rigid materials.

Similarly, the embodiment of FIGS. 9 and 10 is substantially the same as that of FIGS. 5 and 6 also with one exception. The first conductors 24 are separate and attached to the flexible substrate 22 employing a layer of the rigid adhesive 50 in the rigid portions 12 and flexible adhesive 48 in the flexible portions 14 rather than being formed directly on the surface of the substrate 22. As those skilled in the art will readily recognize and appreciate, while not specifically depicted, a third embodiment could be made according to the present invention by combining the exceptions of FIGS. 7 and 8 with those of FIGS. 9 and 10 to have the over-layers 46 extend only over the windows 36 that comprise the flexible portions 14 of the final printed circuit 10''' and having the first conductors 24 separate and attaching them to the flexible substrate 22 employing a layer of the rigid adhesive 50.

In the preferred implementation of the present invention in its various embodiments as described above, the preferred material for the rigid substrate 28 is a polyimide or epoxy material. The preferred over-layer 46 is a polyimide film such as those sold under the names Kapton, Upilex, and Apical. The preferred flexible adhesive 48 is an acrylic adhesive or similar flexible polymer. The preferred rigid adhesive 50 is an epoxy or polyimide prepreg.

The presently contemplated best mode of the various embodiments described above consists of a central plane of Kapton or other polyimide film coextensive throughout the rigid and flexible regions. Copper foil is bonded to either or both surfaces thereof with a flexible adhesive material such as duPont Pyralux in the flexible areas and a rigid adhesive material such as Hitachi Chemical GIA-67N prepreg or Arlon 37N in rigid areas. This construction provides all-flexible materials in flexible areas and virtuallyb all-rigid material in rigid areas. The "virtual" limitation in the rigid areas is the polyimide film which, while actually flexible, is a low-expansion, high modulus material with a high $T_c$ and , therefore, acts like the rigid materials with respect to the thermal expansion problem described earlier herein.

Thus, it can be seen that all the objectives for a multi-level printed circuit combining rigid and flexible portions as stated above are met by the present invention.

Wherefore, having thus described the present invention, what is claimed is:

1. A printed circuit comprising multiple layers and rigid and flexible portions comprising:
    a) a sheet of flexible, polyimide, substrate material extending over the entirety of the rigid and flexible portions;
    b) paths of conductive materials carried by at least one side of said sheet of flexible substrate material in both the rigid and flexible portions;
    c) a sheet of flexible over-layer material extending over the path of conductive material in at least the entirety of all the flexible portions; and
    d) a flexible adhesive material adhesively attaching said sheet of flexible over-layer material to the entirety of all of only the flexible portions.

2. The printed circuit comprising multiple layers and rigid and flexible portions of claim 1 wherein:
    said paths of conductive material carried by at least one side of said sheet of flexible substrate material comprise a conductive foil adhesively attached to said sheet of flexible substrate material with a flexible adhesive in the flexible portions and with a rigid adhesive in the rigid portions.

3. The printed circuit comprising multiple layers and rigid and flexible portions of claim 1 wherein comprising:
    e) sheets of rigid substrate material extending over the entirety of all of only the rigid portions; and
    f) a rigid adhesive material adhesively attaching said sheets of a rigid substrate material to the entirety of all of only the rigid portions;
    said rigid adhesive adhesively attaching said sheet of a rigid substrate material to the entirety of all the rigid portions extending out over the edge of the rigid portions onto the flexible portions over said sheet of flexible over-layer material whereby said sheet of flexible over-layer material is protected from edge portions of said rigid substrate material at points of flexing of the flexible adjacent thereto.

4. The printed circuit comprising multiple layers and rigid and flexible portions of claim 1 wherein:
    a) said sheet of flexible over-layer material also extends over the entirety of all the rigid portions; and additionally comprising,
    b) a rigid adhesive material attaching said sheet of flexible over-layer material to the entirety of all the rigid portions.

5. The method of assembling a printed circuit, comprising multiple layers and rigid and flexible portions, to prevent the formation of voids in adhesive layers thereof and breaks in vias formed therethrough comprising the steps of:
    a) starting with a sheet of flexible, polyimide, substrate material extending over the entirety of the rigid and flexible portions;
    b) forming paths of a conductive material, on at least one side of the sheet of flexible substrate material in both the rigid and flexible portions;
    c) disposing a sheet of flexible over-layer material over the paths of conductive material in at least the entirety of all the flexible portions; and
    d) adhesively attaching the sheet of flexible over-layer material to the entirety of all of only the flexible portions with a flexible adhesive material.

6. The method of claim 5 wherein said step of forming paths of a conductive material on at least one side of the sheet of flexible substrate material comprises:
    adhesively attaching a conductive foil to the sheet of flexible substrate material with a flexible adhesive in the flexible portions and with a rigid adhesive in the rigid portions.

7. The method of claim 5 wherein comprising:
    e) disposing sheets of a rigid substrate material over the entirety of all of only the rigid portions; and
    f) adhesively attaching the sheets of a rigid substrate material to the entirety of all of only the rigid portions with a rigid adhesive material; and
    extending the rigid adhesive adhesively attaching the sheets of a rigid substrate material to the entirety of all the rigid portions out over the edge of the rigid portions onto the flexible portions over the sheet of flexible over-layer material whereby the sheet of flexible over-layer material is protected from edge portions of the rigid substrate material at points of flexing of the flexible portions adjacent thereto.

8. The method of claim 5 and additionally comprising the steps of:
    a) disposing the sheet of flexible over-layer material over the entirety of all the rigid portions; and,
    b) adhesively attaching the sheet of flexible over-layer material to the entirety of all the rigid portions with a rigid adhesive material.

9. A printed circuit according to claim 4 wherein the flexible over-layer material is polyimide.

10. A method according to claim 8 comprising selecting a polyimide as the flexible over-layer material.

11. A printed circuit having multiple circuit layers including a flexible portion and a rigid portion carrying at least one via, each layer comprising:
    a) a flexible polyimide substrate lamina carrying, on at least one side thereof, paths of conductive material extending between and in both a side flexible portion and at least an area of a said rigid portion carrying a said via; and
    b) a sheet of flexible over-layer material extending over the entirety of the paths of conductive material in at least said flexible portion and being attached to both the paths of conductive material and the substrate material in a manner to prevent exposure of at least the conductive paths to the environment throughout the extent of said conductive paths in said flexible portion.

12. The printed circuit of claim 11 wherein:
    an adhesive material adhesively attaches said sheet of flexible over-layer material to said paths of conductive material and said substrate throughout the extent of the over-layer.

13. The printed circuit of claim 12 comprising a rigid substrate material extending over and attached to the entirety of all of only said rigid portion.

14. The printed circuit of claim 13 comprising a rigid adhesive material adhesively attaching said rigid substrate material to the entirety of all of only the said rigid portion;

said rigid adhesive adhesively attaching said rigid substrate material to the entirety of all the said rigid portion extending out over the edge of the said rigid portion onto the said flexible portion over said sheet of flexible over-layer material whereby said sheet of flexible over-layer material is protected from edge portions of said rigid substrate material at points of flexing of the said flexible portion adjacent thereto.

15. The printed circuit of claim 12 wherein:
   a) said sheet of flexible over-layer material also extends over the said rigid portion; and
   b) a rigid adhesive material adhesively attaches said sheet of flexible over-layer material to the said rigid portion.

16. A printed circuit according to claim 15 wherein the flexible over-layer material is polyimide.

* * * * *